United States Patent [19]
Gardner et al.

[11] Patent Number: 5,882,973
[45] Date of Patent: *Mar. 16, 1999

[54] METHOD FOR FORMING AN INTEGRATED CIRCUIT HAVING TRANSISTORS OF DISSIMILARLY GRADED JUNCTION PROFILES

[75] Inventors: Mark I. Gardner, Cedar Creek; Fred N. Hause; H. Jim. Fulford, Jr., both of Austin, all of Tex.

[73] Assignee: Advanced Micro Devices, Inc.

[ * ] Notice: This patent issued on a continued prosecution application filed under 37 CFR 1.53(d), and is subject to the twenty year patent term provisions of 35 U.S.C. 154(a)(2).

[21] Appl. No.: 789,549

[22] Filed: Jan. 27, 1997

[51] Int. Cl.⁶ .................................................. H01L 21/336
[52] U.S. Cl. ........................... 438/279; 438/286; 438/303
[58] Field of Search ................................... 257/336, 344, 257/408, 900; 438/286, 279, 303

[56] References Cited

U.S. PATENT DOCUMENTS

| | | | |
|---|---|---|---|
| 5,115,288 | 5/1992 | Manley . | |
| 5,164,801 | 11/1992 | Hieda et al. | 257/344 |
| 5,254,866 | 10/1993 | Ogoh | 257/344 |
| 5,274,261 | 12/1993 | Chen | 257/344 |
| 5,276,346 | 1/1994 | Iwai et al. | 257/408 |
| 5,329,482 | 7/1994 | Nakajima et al. | 257/344 |
| 5,436,482 | 7/1995 | Ogoh | 257/344 |
| 5,716,866 | 2/1998 | Dow et al. . | |

FOREIGN PATENT DOCUMENTS 405102428  4/1993  Japan ..................................... 257/336

*Primary Examiner*—Jey Tsai
*Attorney, Agent, or Firm*—Kevin L. Daffer; Conley, Rose & Tayon

[57] ABSTRACT

An integrated circuit is provided having a plurality of transistors either NMOS transistors, or PMOS transistors, or both NMOS and PMOS transistors. The transistors are formed having dissimilarly sized spacers. The spacers can be made larger in lateral areas on transistors designated as lower performing transistors than smaller spacers used on transistors which are higher performing. The dissimilarly sized spacers produce correspondingly sized lightly doped drain (LDD) areas. Accordingly, the present integrated circuit includes on a single monolithic substrate both high and low performance transistors based upon formation of dissimilarly sized spacers at sidewall surfaces of select transistor gate conductors.

16 Claims, 2 Drawing Sheets

METHOD FOR FORMING AN INTEGRATED CIRCUIT HAVING TRANSISTORS OF DISSIMILARLY GRADED JUNCTION PROFILES

BACKGROUND OF THE INVENTION

1. Field of the Invention

This invention relates to semiconductor processing and, more particularly, to a method of forming and removing spacer layers upon and from, respectively, sidewall surfaces of a gate conductor and substrate proximate to the gate conductor. An etch stop layer formed upon the gate conductor and substrate serves to protect, during spacer formation, against overetch into the underlying gate conductor and substrate.

2. Description of Related Art

Fabrication of a metal-oxide semiconductor ("MOS") transistor is well known. The manufacture of an MOS transistor begins by defining active areas where the transistor will be formed. The active areas are isolated from other areas on the semiconductor substrate by various isolation structures formed upon and within the substrate. Isolation structures come in many forms. For example, the isolation structures can be formed by etching trenches into the substrate and then filling the trenches with a dielectric fill material. Isolation structures may also be formed by locally oxidizing the silicon substrate using the well recognized LOCOS technique.

Once the isolation structures are defined between transistor active areas, a gate dielectric is formed. Typically, the gate dielectric is formed by thermal oxidation of the silicon substrate. Thermal oxidation is achieved by subjecting the substrate to an oxygen-bearing, heated ambient in, for example, an oxidation furnace or a rapid thermal annealer ("RTA"). A gate conductor material is then deposited across the entire dielectric-covered substrate. The gate conductor material is preferably polycrystalline silicon, or polysilicon. The polysilicon layer is then patterned using a photolithography mask. The mask allows select removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

The patterned gate conductor material, if polysilicon, is rendered conductive with the introduction of ions from an implanter or a diff-usion furnace. Depending on the implant species forwarded into the gate conductor, either an n-channel transistor (NMOS transistor) or a p-channel transistor (PMOS transistor) is formed. NMOS transistors employ n-type dopants on opposite sides of the NMOS gate conductor, whereas PMOS transistors employ p-type dopants on opposite sides of the PMOS transistor gate conductor. The regions of the substrate which receive dopants on opposite sides of the gate conductor are generally referred to as junction regions, and a distance between junction regions is typically referred to as the physical channel length. After implantation and subsequent diffusion of the junction regions, the distance between the junction regions becomes less than the physical channel length and is often referred to as the effective channel length ("Leff"). In high density designs, not only does the physical channel length become small so to must the Leff As Leff decreases below approximately 1.0 $\mu$m, for example, a problem known as short channel effects ("SCE") becomes predominant.

A problem related to SCE, and the subthreshold currents associated therewith, but altogether different is the problem of hot-carrier effects ("HCE"). HCE is a phenomenon by which hot-carriers ("holes and electrons") arrive at or near an electric field gradient. The electric field gradient, often referred to as the maximum electric field ("Em") occurs near the drain during saturated operation. More specifically, the electric field is predominant at the lateral junction of the drain adjacent to the channel. The electric field at the drain causes primarily electrons in the channel to gain kinetic energy and become "hot". These hot electrons traveling to the drain lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor. It is known that since hot electrons are more mobile than hot holes, HCE causes a greater threshold skew in NMOS transistors than PMOS transistors. Nonetheless, a PMOS transistor will undergo negative threshold skew if its Leff is less than, e.g., 0.8 $\mu$m.

Unless modifications are made to the process in which relatively small transistors are formed, problems with subthreshold current and threshold shift resulting from SCE and HCE will remain. To overcome these problems, alternative drain structures such as double-diffused drain ("DDD") and lightly doped drain ("LDD") structures must be used. The purpose of both types of structures is the same: to absorb some of the potential into the drain and thus reduce Em. The popularity of DDD structures has given way to LDD structures since DDD causes unacceptably deep junctions and deleterious junction capacitance.

A conventional LDD structure is one whereby a light concentration of dopant is self-aligned to the edge of the gate conductor. The light-dopant concentration is then followed by a heavier-dopant concentration which is self-aligned to a spacer formed on the sidewalls of the gate conductor. The purpose of the first implant dose is to produce a lightly doped section into the junction areas at the gate edge near the channel. The second implant dose is spaced from the channel a distance dictated by the thickness of the sidewall spacer. Resulting from the first and second implants, a dopant gradient occurs across the junction from the source/drain area of the junction to the LDD area adjacent the channel.

A conventional spacer is one which is generally formed by a single deposition, followed by a single anisotropic etch. The spacer therefore comprises a single layer of material formed on sidewall surfaces of the gate conductor. Resulting from the single spacer construction, an LDD area is defined immediately below that spacer adjacent the channel. The source/drain region is spaced from the channel a distance dictated by the LDD area. While the LDD area serves to reduce HCE, it nonetheless proves detrimental to the performance of the ensuing transistor. This detriment is the result of added parasitic resistance arising from the lightly doped LDD region. Added parasitic resistance typically decreases saturation current (i.e., current above threshold). Further, parasitic resistance can decrease drive strength and the overall speed of the transistor.

In most integrated circuit applications there are transistors which are required to be high performance transistors. In those instances, high performance transistors should have minimal LDD areas if any at all. The lower performing transistors should have larger LDD areas so they do not suffer HCE reliability problems. It would therefore be desirable to derive a fabrication technique whereby certain transistors within an integrated circuit employ larger LDD areas than other transistors. The integrated circuit formed by such a process would be tailored with LDD regions specifically designed to the performance of the transistor being produced. The junction region of each transistor within the monolithic circuit could therefore be customized to a particular dopant concentration profile and peak concentration depth depending upon the performance desired.

SUMMARY OF THE INVENTION

The problems outlined above are in large part solved by an integrated circuit and integrated circuit fabrication method hereof. The present structure and method employs single layer spacers on sidewall surfaces of certain gate conductors while dual layer (or more) spacers are employed on sidewall surfaces of other gate conductors. The single layer spacer affords a smaller LDD region beneath the spacer than LDD areas beneath dual layer spacers. As such, the present process can produce an integrated circuit having high performance transistors simultaneous with production of lower performance transistors.

The present process is utilized in the formation of an integrated circuit derived from NMOS transistors, PMOS transistors, or a combination of NMOS and PMOS transistors (CMOS process). Accordingly, the spacers configured adjacent gate conductors can serve to mask n-type implants, p-type implants or a combination of both. Specifically, the spacers, in combination with gate conductors, serve as a composite mask against implant of heavier concentration source/drain implant species into source/drain areas within the junction. The source/drain areas, in combination with the LDD areas comprise the junction extents. It is recognized that the LDD area can be formed either before the source/drain area or after. In the latter instance, the spacers are removable from an etch stop material formed between the spacer and the underlying gate conductor and substrate. The etch stop serves to prevent harm to the underlying surfaces during formation of the spacer, or during times when a layer of spacer is removed altogether. Thus, the present process forms spacers of dissimilar lateral thicknesses (either single or dual layer spacers) using an anisotropic etch process. The anisotropic etch removes the spacer material from horizontal surfaces of the etch stop while retaining spacer material on vertical surfaces of the etch stop proximate to the gate conductor sidewall surfaces.

Broadly speaking, the present invention contemplates an integrated circuit formed with gate conductors of select transistors having larger spacer thicknesses than gate conductors of other transistors. The larger spacers afford greater HCE protection, while the smaller spacers provide higher performance transistors.

The integrated circuit is formed having a first transistor spaced from a second transistor upon and within a semiconductor substrate. The first transistor is formed by a first gate conductor dielectrically spaced over a first channel area, and the second transistor is formed by a second gate conductor dielectrically spaced over a second channel area. The first gate area is interposed between a first pair of junctions, and the second channel area is interposed between a second pair of junctions. A first spacer is configured upon each of the first pair of junctions adjacent the first gate conductor to define a masking surface to which an implant area is aligned a first spaced distance from the first channel area. A second spacer is configured upon each of the second pair of junctions adjacent the second gate conductor to define a masking surface to which an implant area is aligned a second spaced distance from the second channel area. The second spaced distance is dissimilar from the first spaced distance to define an LDD area adjacent the first channel which is dissimilar from the LDD area adjacent the second channel. If the LDD area is smaller adjacent the first channel, then the first transistor is defined as a higher performance transistor than the second transistor.

It is further contemplated that an integrated circuit is formed by an improved method hereof The method includes providing a first channel area and a second channel area spaced from each other within a semiconductor substrate. A first gate conductor is patterned a spaced distance from a second gate conductor. The first and second gate conductors are patterned upon a gate dielectric over respective first and second channel areas. An oxide layer is then thermally grown upon the first and second gate conductors and upon junctions configured between the first and second gate conductors. The junctions are defined within the semiconductor substrate between the first and second channel areas. A single layer spacer is then formed to extend a first lateral distance from the first gate conductor. A dual layer spacer is subsequently formed a second lateral distance from the second gate conductor. The second lateral distance is defined to be greater than the first lateral distance.

BRIEF DESCRIPTION OF THE DRAWINGS

Other objects and advantages of the invention will become apparent upon reading the following detailed description and upon reference to the accompanying drawings in which.

Figure 1:
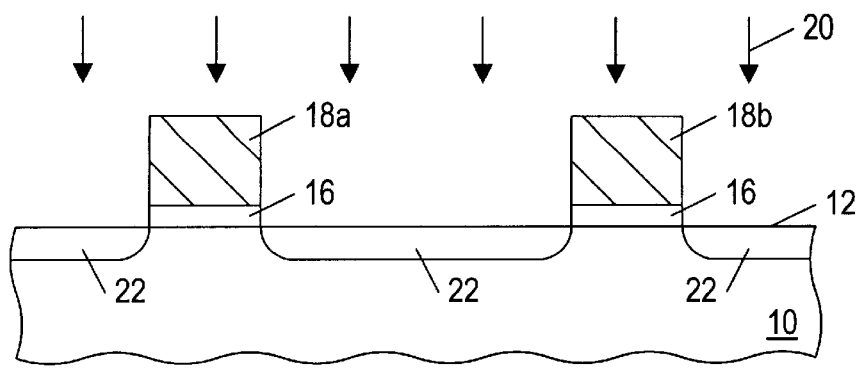
FIG. 1 is a partial cross-sectional view of semiconductor topography having a pair of gate conductors spaced across the topography, and LDD areas defined between the gate conductors.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 illustrates a partial cross-sectional view of a semiconductor substrate 10 having an upper surface 12. Semiconductor substrate 10 preferably comprises lightly doped n-type or p-type single crystalline silicon having a resistivity suitably in the range of 12 ohms-cm. If the ensuing transistors are to be series-connected, an isolation structure is typically not present between the transistors and therefore does not electrically isolate the source side of one transistor from the drain side of the other. FIG. 1 illustrates series-connection. Alternatively, the ensuing transistors may be electrically isolated by an isolation structure placed within substrate 10 between the transistors. Isolation is performed either by a shallow trench filled with a dielectric or by the well-known LOCOS process.

Patterned upon upper surface 12 are gate dielectrics 16 and gate conductors 18. Gate conductor 18a is spaced a lateral distance from gate conductor 18b, either with or without an isolation structure configured therebetween.

Gate conductor 18 is preferably patterned from a polycrystalline silicon (polysilicon) material using well-known lithography procedures. Gate conductor 18 and underlying gate dielectric 16 exist in select regions between isolation structures 14, those regions being defined as active regions. Active regions are regions which lie between isolation structures. A subset of active regions are junction areas, defined as areas between isolation structures and channels underlying gate conductors 18. FIG. 1 illustrates an implant 20 forwarded into junction areas 22. The implant is preferably a lightly doped concentration of either n-type or p-type species. Accordingly, implant 20 is defined as an LDD implant; the concentration and energies of the implanted species of implant 20 can vary provided the concentrations and energies are less than source and drain implants, which follow. LDD implant 20 is masked by gate conductor 18 using the well recognized self-aligned process.

Figure 2:
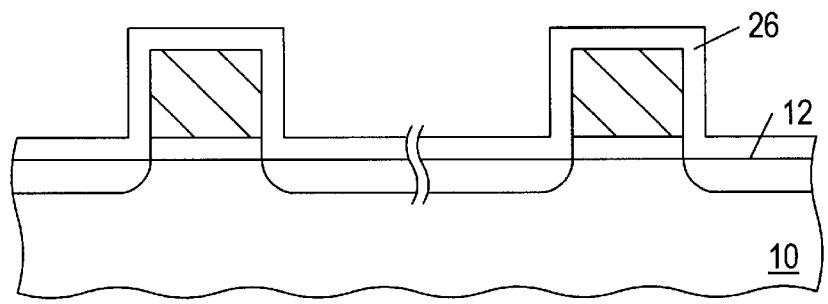
FIG. 2 is a partial cross-sectional view of the semiconductor topography according to a processing step subsequent to FIG. 1, wherein an oxide is formed as an etch stop across the gate conductors and topography between gate conductors.

FIG. 2 illustrates an etch stop 26 formed upon the exposed surfaces of gate conductor 18 and topography 12. According to one embodiment, etch stop 26 comprises a single layer of thermally grown oxide. The oxide is formed in a thermal oxidation furnace using temperatures in the range of 700° C. to 900° C., preferably. Alternatively, the oxide can be deposited instead of being grown. If deposited, the oxide is formed according to chemical vapor deposition ("CVD") techniques using an oxide-bearing feed source. In an alternative embodiment, etch stop 26 may comprise a dual layer film. The lower-most layer preferably comprises either grown or deposited oxide and the uppermost layer preferably comprises CVD nitride. If etch stop 26 comprises a single layer of oxide, the oxide is grown or deposited to a thickness of approximately 300 to 600 angstroms. However, if etch stop 26 is a dual layer, then the underlying oxide is in the range between 100 to 200 angstroms, and the overlying nitride is preferably 50 to 400 angstroms in thickness. The oxide in the dual layer etch stop scheme serves to buffer stress differences between the overlying nitride and the underlying silicon or polysilicon. The oxide is therefore referred to as a "pad" oxide. The nitride of the dual layer etch stop is more resistant to etch and therefore provides higher selectivity if the overlying spacer material being removed is, for example, polysilicon or oxide. However, if the overlying material is nitride, then etch stop 26 should preferably be a single layer oxide, rather than a dual layer oxide and nitride. Thus, depending on the overlying material, etch stop 26 will change.

Figure 3:
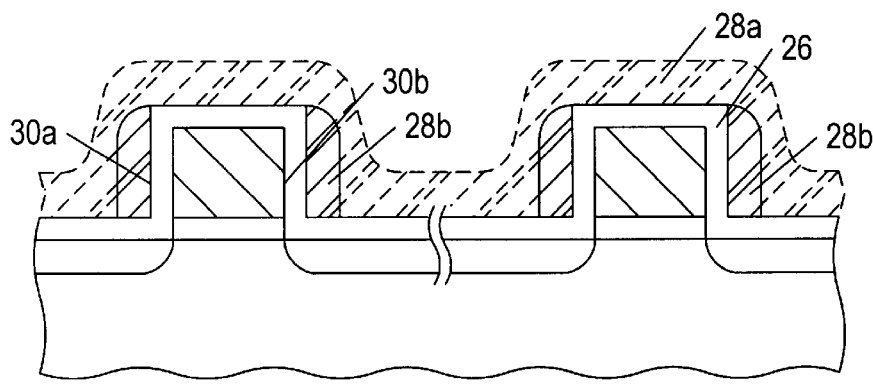
FIG. 3 is a partial cross-sectional view of the semiconductor topography according to a processing step subsequent to FIG. 2, wherein a first layer of spacer material is deposited and selectively removed to form a single layer spacer on sidewall surfaces of each gate conductor.

FIG. 3 illustrates deposition of a partially sacrificial material 28a. Material 28a preferably comprises any material which is more susceptible to an etchant than the underlying etch stop 26. Material 28a is preferably deposited from a CVD apparatus to form a substantially conformal layer. According to one embodiment, material 28a comprises nitride. According to another embodiment, material 28a comprises polysilicon. According to yet a further embodiment, material 28a comprises oxide. In any case, material 28a undergoes an anisotropic etch. Anisotropic etch is designed as a plasma etch employing both physical and chemical removal mechanisms. Ions are bombarded at an angle substantially perpendicular to surface 12. This causes substantially horizontal surfaces to be removed faster than substantially vertical surfaces. Accordingly, anisotropic etch removes a portion of material 28a, that portion existing over horizontal surfaces of etch stop 26 above gate conductor 18 and above substrate 10 a spaced distance from the channel area. The only regions of material 28a which remain are those regions near substantially vertical surfaces (i.e., regions approximate to sidewall surfaces 30a and 30b of gate conductor 18a and 18b). The remaining regions of material 28a are henceforth referred to as spacer 28b and, more specifically, single layer spacer 28b.

Figure 4:
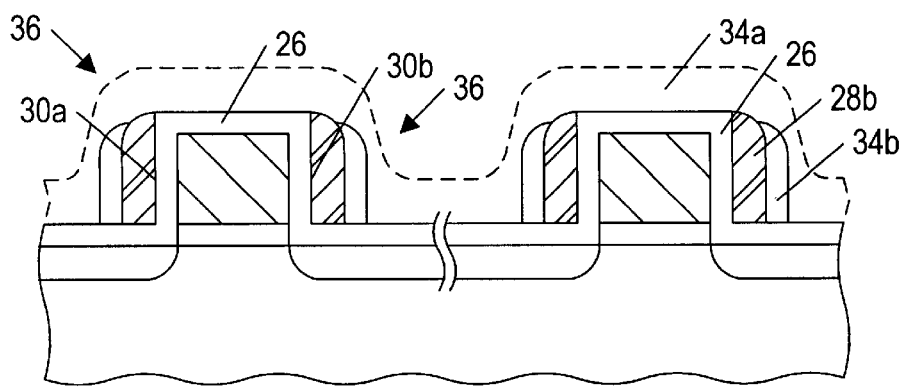
FIG. 4 is a partial cross-sectional view of the semiconductor topography according to a processing step subsequent to FIG. 3, wherein a second layer of spacer material is deposited and selectively removed to form a dual layer spacer on sidewall surfaces of each gate conductor.

FIG. 4 illustrates deposition of another partially sacrificial material 34a. Material 34a comprises any material which etches at a dissimilar rate from that of spacer 28b and etch stop 26. If spacer 28b is nitride, then material 34a is polysilicon or oxide. Likewise, if spacer 28b is polysilicon, then material 34a is nitride or oxide. Still further, if spacer 28b comprises metal, then material 34a comprises a dielectric, or vice versa.

An anisotropic etch is applied to material 34a to remove it from substantially horizontal surfaces while retaining it on substantially vertical surfaces. Resulting from the anisotropic etch, etch stop 26 is exposed on horizontal surfaces, and retained material remains on vertical surfaces adjacent single layer spacer 28b. The retained portions of material 34a are referred to as another single layer spacer 34b. The combination of spacers 28b and 34b form a dual layer spacer 36. Spacer 36 resides on etch stop 26 approximate to opposed sidewall surfaces 30a and 30b.

Figure 5:
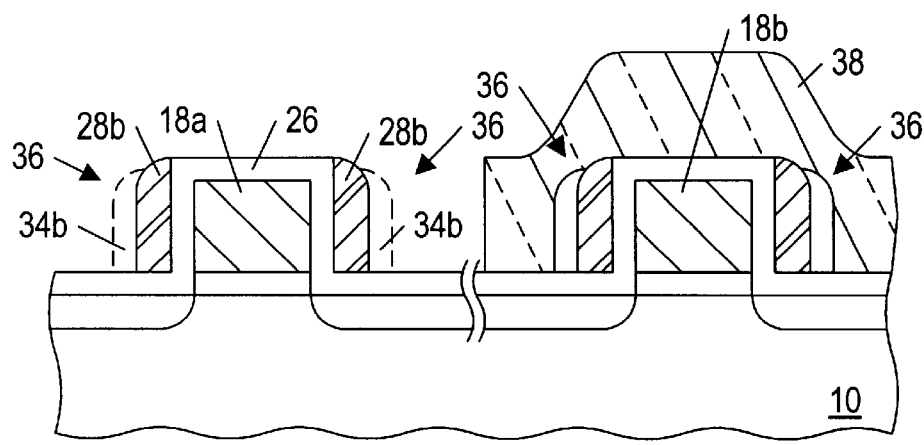
FIG. 5 is a partial cross-sectional view of the semiconductor topography according to a processing step subsequent to FIG. 4, wherein one layer of the dual layer spacer is removed from a non-protected gate conductor.

Dual layer spacer 36 associated with gate conductor 18b is covered in accordance with the processing step shown in FIG. 5. The other gate conductor 18a is designated to form a higher performance transistor than the transistor formed by gate conductor 18b. Specifically, photoresist 38 is selectively removed from the regions around gate conductor 18a to expose dual layer spacer 36 associated therewith. An etch composition (preferably a wet etch) is chosen to remove the outer spacer 34b of the exposed dual layer spacer 36. The etch composition is therefore said to be selective to the material of spacer 34b while non-selective to the material of spacer 28b. Furthermore, the etchant does not significantly attack etch stop 26 and therefore will not jeopardize the integrity of the underlying silicon substrate 10 or gate conductor 18a.

Figure 6:
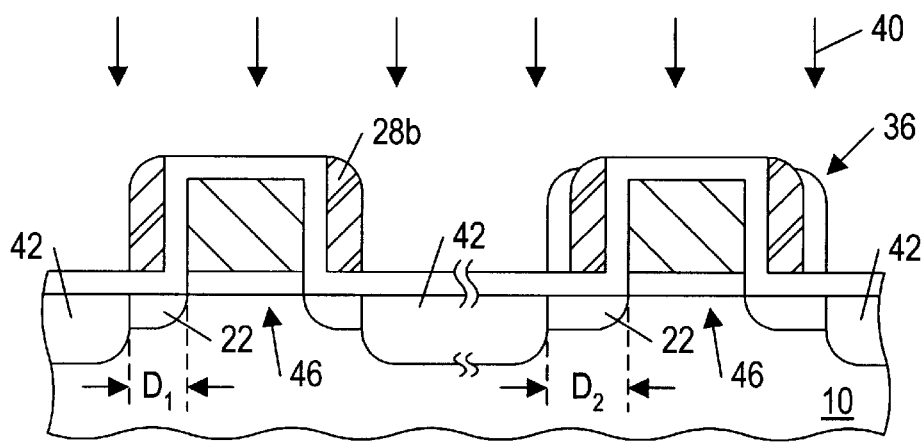
FIG. 6 is a partial cross-sectional view of the semiconductor topography according to a processing step subsequent to FIG. 5, wherein source and drain areas are defined a spaced distance from channel areas according to dissimilarly sized single and dual layer spacers; and, FIG. 7 is a partial cross-sectional view of the semiconductor topography according to a processing step subsequent to FIG. 6, wherein contact regions are formed according to a salicide process, and gate conductor contact is made based possibly on the length or routing to that conductor or the desired performance of the ensuing transistor.

FIG. 6 illustrates an implant 40 forwarded into the non-masked areas of substrate 10. Implant 40 is designated a source and drain implant having a greater concentration of implant species and forwarded at greater energies than implant 20 (shown in FIG. 1). Implant 40 extends into junction areas of substrate 10 as source/drain areas 42. Masking afforded by the remaining single layer spacer 28b proximate to gate conductor 18a and dual layer spacer 36 proximate to gate conductor 18b provides self-alignment of source/drain regions 42 to the outer vertical surfaces of the single and dual layer spacers. As such, source/drain areas are drawn away from channel 46. The amount at which the source/drains are drawn is dependent upon whether a single or dual layer spacer exists. If a single layer spacer is used to align the source/drain, then LDD area 22 has a width defined by $D_1$. Conversely, if a dual layer spacer 26 defines the source/drain area 42, the LDD 22 has a width defined as $D_2$. Shown in FIG. 6, LDD width $D_2$ is greater than LDD width $D_1$.

It is recognized, given the benefit of this disclosure that differences in LDD area can be obtained in several ways. Instead of forming dual layer spacers on every gate conductor sidewall and then selectively removing one of the dual layer spacers, other techniques can be used to achieve the same result. For example, dual layer spacers can only be formed on select sidewall surfaces, leaving the other sidewall surfaces with only a single spacer. In this instance, the second spacer layer is additively applied to only select sidewall surfaces, rather than removed from select surfaces. The present invention yet further contemplates use of a single layer of greater or lessened thickness depending upon the sidewall surface on which it is formed. In this instance, dual layer spacers are not used. Instead, high performance transistors employ spacers which have been partially removed compared to spacers on low performance transistor gate conductors. To produce a single layer spacer on all sidewall surfaces, with some spacers of lessened thickness, a photoresist is used to cover the spacers which are not to be partially removed. The exposed spacers are partially removed and, specifically, lessened in lateral thickness by applying an isotropic etch for a pre-defined timed duration. The timed etch is terminated after the spacer thickness is lessened sufficient to accommodate a smaller LDD area directly beneath the partially removed spacer. Regardless of the technique or sequence of fabrication steps chosen, it is the intent of the present integrated circuit to have selective transistors with lessened LDD areas than other transistor LDD areas. The selected transistors with lessened LDD areas are designated high performance, high speed transistors which turn-on rapidly with minimal parasitic capacitance and resistance associated therewith.

Figure 7:
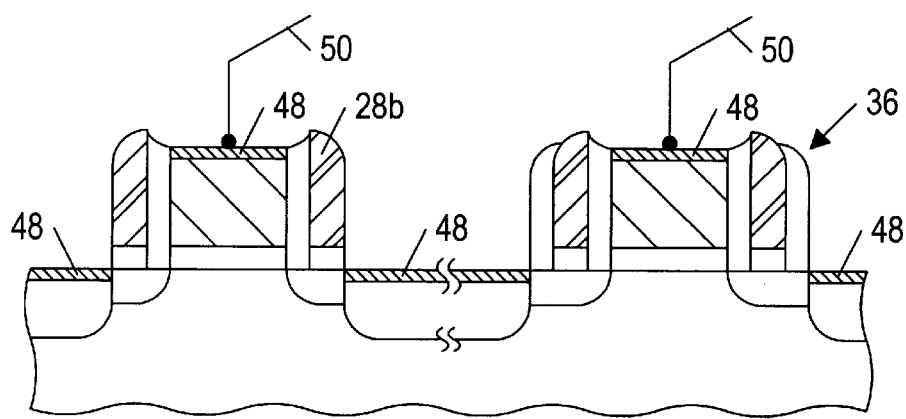

FIG. 7 illustrates salicidation of exposed silicon-based surfaces. Specifically, FIG. 7 depicts a salicide process in which a salicide/polycide 48 is formed in the junctions and polysilicon surfaces of the ensuing transistors. The salicide results from depositing a refractory metal on the exposed semiconductor topography. The metal undergoes a two-step anneal process. The first anneal cycle causes a first phase reaction. All the nonreacted metal is removed except in regions where the silicon atoms are prevalent. As such, regions between silicon-rich areas serve to prevent silicide growth. Those regions are denoted as the sidewall spacer structures, either a single layer spacer 28b or a dual layer spacer 36. Accordingly, the exposed surfaces of spacers 28b and 36, are not conducive to silicide growth. If the spacer outer surface is made of polysilicon or metal, then the polysilicon and metal layers are removed and replaced with either an oxide or nitride layer. The second anneal step causes a second phase reaction of refractory metal only in silicon-based junctions and possibly on the upper surfaces of the polysilicon gate conductor 18. The silicide serves to enhance conductivity of subsequent metalization layers drawn to the junctions. For sake of brevity and clarity in the drawings, the interlevel dielectrics and subsequent metalization layers are not shown. Instead, it is understood that contact to the printed conductors are made to silicide 48, some of which are shown as reference numeral 50. It is understood that an integrated circuit which utilizes the present process will have subsequent fabrication steps involving interlevel dielectrics and one or more layers of metalization.

It will be appreciated to those skilled in the art having the benefit of this disclosure that the present processing sequences are believed to be capable of forming junctions with source/drain areas and dissimilarly sized LDD areas. The LDD implant can occur either before or after the source/drain implant. Preferably, the LDD implant occurs before the source/drain implant; however, the spacers can be removed in their entirety so that the LDD implant occurs after the source/drain implant, if desired. It is to be understood that the form of the invention shown and described is taken as exemplary, presently preferred embodiments. Various modifications and changes may be made without departing from the spirit and scope of the invention as set for the claims. It is intended that the following claims be interpreted to embrace all such modifications and changes.

What is claimed is:

1. A method for forming an integrated circuit, comprising:
   providing a first channel area and a second channel area spaced from each other within a semiconductor substrate;
   patterning a first gate conductor and a second gate conductor a dielectric distance over respective first and second channel areas;
   forming an etch stop layer upon the first and second gate conductors and upon junctions configured within the semiconductor substrate between the first and second channel areas;
   forming, from a first material, first spacers extending a first lateral distance from the first and second gate conductors;
   forming, from a second material different from the first material, second spacers extending a second lateral distance from the first and second gate conductors; and
   selectively removing the second spacers from a region adjacent the second gate conductor while retaining the second spacers adjacent the first gate conductor.

2. The method as recited in claim 1, further comprising forming isolation structures between the first gate conductor and the second gate conductor.

3. The method as recited in claim 1, wherein said forming the first spacers comprises:
   depositing the first material upon the first and second gate conductors; and
   selectively removing the first material from substantially horizontal surfaces of the etch stop layer such that the first material remains proximate only to sidewall surfaces of the first and second gate conductors.

4. The method as recited in claim 3, wherein said selectively removing the first material comprises anisotropically etching the first material layer at a faster rate along horizontal surfaces of the etch stop layer than along vertical surfaces of the etch stop layer.

5. The method as recited in claim 1, wherein said forming the second spacers comprises:

depositing the second material upon the first and second gate conductors; and selectively removing the second material from substantially horizontal surfaces of the etch stop layer and the first spacers such that the second material remains proximate only to sidewall surfaces of the first and second gate conductors.

6. The method as recited in claim 5, wherein said selectively removing the second material comprises anisotropically etching the second material layer at a faster rate along horizontal surfaces of the etch stop layer than along vertical surfaces of the etch stop layer and of the first spacers.

7. The method as recited in claim 1, wherein the etch stop layer comprises a material selected from the group consisting of thermally grown silicon dioxide and chemical vapor deposited silicon dioxide.

8. The method as recited in claim 1, wherein the etch stop layer comprises a lower layer and an upper layer.

9. The method as recited in claim 1, wherein the etch stop layer comprises:

a lower layer comprising a material selected from the group consisting of thermally grown oxide and chemical vapor deposited silicon dioxide; and an upper layer comprising chemical vapor deposited silicon nitride.

10. The method as recited in claim 1, wherein the first spacer comprises a material selected from the group consisting of silicon dioxide, polysilicon, and silicon nitride.

11. The method as recited in claim 1, wherein the second spacer comprises a material selected from the group consisting of silicon dioxide, polysilicon, and silicon nitride.

12. The method as recited in claim 1, wherein selective removal of the second spacers comprises:

forming a masking layer on the first gate conductor;

performing an etch selective to the second material such that the first spacer is retained adjacent the second gate conductor; and removing the masking layer from the first gate conductor.

13. The method as recited in claim 1, further comprising forming lightly doped drains adjacent the gate conductors prior to forming the etch stop layer.

14. The method as recited in claim 1, further comprising forming source and drain areas following removal of the second spacers from adjacent the second gate conductor.

15. The method as recited in claim 14, further comprising:

removing the etch stop layer from above the gate conductors and the source and drain regions;

depositing a refractory metal across the gate conductors, the spacers, and the source and drain areas;

heating the refractory metal to form a metal silicide on the gate conductors and the source and drain regions; and removing unreacted metal from the spacers.

16. The method as recited in claim 1, wherein selectively removing the second spacers from the region adjacent the second gate conductor while retaining the second spacers adjacent the first gate conductor comprises removing only a portion of said second spacers from adjacent said second gate conductor such that said second spacers extend a third lateral distance from said second gate conductor, and wherein said third lateral distance is less than said second lateral distance.

* * * * *